(12) United States Patent
Chu et al.

(10) Patent No.: US 7,897,480 B2
(45) Date of Patent: Mar. 1, 2011

(54) PREPARATION OF HIGH QUALITY STRAINED-SEMICONDUCTOR DIRECTLY-ON-INSULATOR SUBSTRATES

(75) Inventors: Jack O. Chu, Manhasset Hills, NY (US); Alexander Reznicek, Mount Kisco, NY (US); Philip A. Saunders, Millwood, NY (US); Leathen Shi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 957 days.

(21) Appl. No.: 11/738,837

(22) Filed: Apr. 23, 2007

(65) Prior Publication Data

US 2008/0261055 A1   Oct. 23, 2008

(51) Int. Cl.
*H01L 21/30* (2006.01)
*H01L 21/46* (2006.01)
(52) U.S. Cl. ............... 438/455; 438/458; 257/E21.129
(58) Field of Classification Search ............. 438/455, 438/458, 660; 257/E21.129, E21.568, E21.119, 257/E21.567
See application file for complete search history.

(56) References Cited

U.S. PATENT DOCUMENTS

| | | | |
|---|---|---|---|
| 6,524,935 B1 | 2/2003 | Canaperi et al. | |
| 6,649,492 B2 | 11/2003 | Chu et al. | |
| 6,805,962 B2 | 10/2004 | Bedell et al. | |
| 6,963,078 B2 | 11/2005 | Chu | |
| 2003/0013275 A1* | 1/2003 | Burden | 438/458 |
| 2005/0285097 A1 | 12/2005 | Shang et al. | |
| 2006/0054891 A1 | 3/2006 | Chu et al. | |

FOREIGN PATENT DOCUMENTS

WO   WO 00/54338   9/2000

OTHER PUBLICATIONS

Koester, S. J. et al. "Extremely High Transconductance Ge/Si0.4Ge0.6 p-MODFET's Grown by UHV-CVD," IEEE Electron Device Letters, Mar. 2000, pp. 110-112, vol. 21, No. 3.
Shahidi, G. G., "SOI Technology for the GHz Era," IBM J. Res. & Dev., Mar./May 2002, pp. 121-131, vol. 46, No. 2/3.
Mizuno, T. et al., "High Performance Strained-Si p-MOSFETs on SiGe-on-Insulator Substrates Fabricated by SIMOX Technology," IEDM, IEEE, 1999, pp. 22.8.1-22.8.3.
Komarov, Pavel L. et al.,"Transient Thermo-Reflectance Measurements of the Thermal Conductivity and Interface Resistance of Metallized Natural and Isotopically-Pure Silicon," Microelectronics Journal, 2003, pp. 1115-1118, vol. 34.

* cited by examiner

*Primary Examiner*—Walter L Lindsay, Jr.
(74) *Attorney, Agent, or Firm*—Scully, Scott, Murphy & Presser, P.C.; Louis J. Percello, Esq.

(57) ABSTRACT

A method for achieving a substantially defect free SGOI substrate which includes a SiGe layer that has a high Ge content of greater than about 25 atomic % using a low temperature wafer bonding technique is described. Similarly, a method for forming thin to ultra-thin strain Si, SiC, or SiC/Si layers directly on insulator substrates having a strain content in the range of about 1-5% is further described.

7 Claims, 5 Drawing Sheets

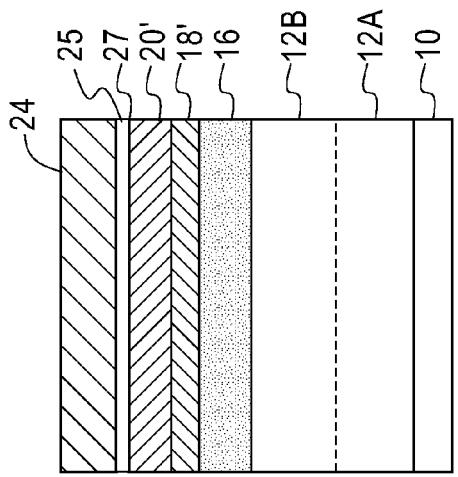
FIG. 4C
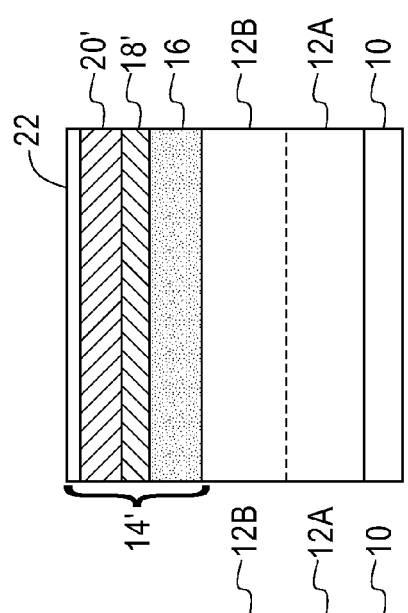
FIG. 4B
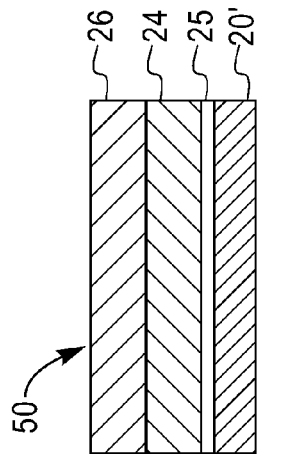
FIG. 4F
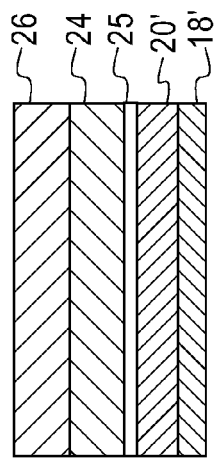
FIG. 4E
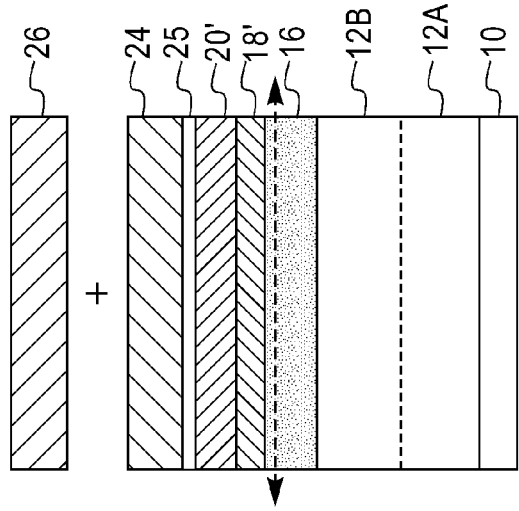
FIG. 4A
FIG. 4D

PREPARATION OF HIGH QUALITY STRAINED-SEMICONDUCTOR DIRECTLY-ON-INSULATOR SUBSTRATES

FIELD OF THE INVENTION

The present invention relates to the fabrication and preparation of high quality, near defect-free SiGe-on-insulator (SGOI), strained-Si-directly-on-insulator (SSDOI) and silicon carbon-on-insulator (SCOI) substrates. In particular, the present invention relates to the realization of high Ge content (>30%) SGOI substrates suitable for tensilely strained (>1.2%) silicon or SiC n-FET devices or compressively strained SiGe/Ge p-FET devices. In addition, the invention further describes a method for preparing defect free tensilely strained silicon or SiC (>1%) directly-on-insulator (SSDOI) using a low-temperature "smarter-cut" wafer bonding approach. The invention in general relates to semiconductor devices made in these strained Si, SiC or SiGe/Ge based layers and to electronic systems or processors built with such devices.

BACKGROUND OF THE INVENTION

Today's integrated circuits (ICs) include a vast number of transistor devices formed in a semiconductor and currently, smaller devices are the key trend to enhance device performance and to increase reliability. As devices are scaled down, however, the integration technology becomes more complex and new methods are needed to maintain the expected performance enhancement from one generation of devices to the next. In this regard, the semiconductor that has progressed the farthest is the primary semiconductor material of microelectronics, silicon (Si), or more broadly, Si-based materials. One such Si-based material of high importance for microelectronics is a silicon germanium (SiGe) alloy.

One of the most important indicators of potential device performance is the carrier mobility, and as the scaling trend continues there is a great difficulty in keeping the carrier mobility high in these scaled devices of the deep submicron generations. A promising avenue towards better carrier mobility is to slightly modify the semiconductor that serves as the raw material for device fabrication. It has been known, and recently studied, that tensilely or compressively strained semiconductors have intriguing carrier properties. In particular, a 90-95% improvement in the electron mobility has been achieved in a strained silicon (Si) channel nMOS as described in U.S. Pat. No. 6,649,492 B2 to J. O. Chu et al. entitled "A strained Si Based Layer Made by UHV-CVD, and Devices Therein" incorporated herein by reference.

Similarly for hole enhancement, compressively-strained buried germanium (Ge) MODFETs have yielded high hole mobilities as described by S. J. Koester et al. in "Extremely high transconductance Ge/Si$_{0.4}$Ge$_{0.6}$ p-MODFETs grown by UHV-CVD," IEEE Elect. Dev. Lett. 21, 110 (2000), and in PCT Patent Application No. US 00/06258, filed Mar. 11, 2000 (Publication No. WO 00/54338) entitled "A High Speed Ge-Channel SiGe/Ge/SiGe Heterostructure for Field Effect Transistor" by J. O. Chu, and more recently, in U.S. Ser. No. 10/876,155, filed Jun. 24, 2004 and entitled "Integration of Strained Ge into Advanced CMOS Technology" by H. Shang et al., all incorporated herein by reference.

Finally, the synergistic combination of tensilely and compressively strained SiGe regions within the same wafer is also described in U.S. Pat. No. 6,963,078, to J. O. Chu, entitled "Dual Strain-State SiGe Layer for Microelectronics." This disclosure is also incorporated herein by reference.

Ideally, for high performance integrated circuits one would like to have the electron conduction type devices, such as nMOS, nMODFET to be hosted in a tensilely strained Si or SiGe material, while the hole conduction type devices such as pMOS, pMODFET be hosted in a compressively strained Ge or SiGe material. Furthermore, it is well known to those skilled in the art that in a strained silicon channel the degree of electron nobility enhancement strongly depends on the strain level in the strain silicon or silicon carbon (SiC) alloy layer. In other words, the higher the imposed "tensile" strain, the higher the induced enhancement on electron mobility would be. The most common practice for applying or inducing tensile strain to a silicon or SiC layer is through the use of an underlying silicon germanium (SiGe) buffer layer, which is typically a relaxed SiGe layer having a larger lattice constant as compared to bulk silicon. Hence, by increasing the Ge content of the underlying SiGe buffer layer, which in turn increases the lattice constant of the SiGe buffer layer, a higher "tensile" strain can be imposed to the silicon or SiC layer due to a larger lattice mismatch between the two layers.

It is also well known that metal oxide semiconductor field effect transistor (MOSFET) devices fabricated on silicon-on-insulator (SOI) substrates can have up to 25-35% better performance than those built on bulk Si wafers due to lower parasitic capacitance of the source/drain junction, reduced short channel effects and better device isolation. This is reported, for example, by G. G. Shahidi, "SOI Technology for GHz Era", IBM J. Res. & Dev., Vol. 46, pp. 121-131 (2002). Thus, it is desirable to combine these two effects to generate a strained silicon or SiC channel having enhanced carrier mobility on a SiGe-on-insulator (SGOI) substrate to achieve an even higher device performance gain.

In view of the above, a method is needed to generate a high Ge content (x>30%), near defect-free SGOI substrate suitable for high mobility strained-Si or strained-SiC nFET devices.

Previously, the ability to create a near defect-free SGOI substrate with a high Ge content (x>30%) has been a difficult problem to address. Although thermally-mixed (TM) SGOI as described in U.S. Pat. No. 6,805,962 B2 to S. W. Bedell et al. entitled "Method of Creating High Quality Relaxed SiGe-On-Insulator for Strained Si CMOS Applications" incorporated herein by reference, has provided an alternative approach to creating a SGOI substrate, the SiGe layers typically formed on the TM-SGOI wafers is only partially relaxed, i.e., about 50 to 80% and have yet to achieve a fully relaxed SiGe layer having greater than 90% degree of relaxation.

In a similar fashion, the same difficulty has been encountered in preparation of SGOI substrates generated by the alternate SIMOX approach. See, for example, T. Mizuno et al., "High Performance Strained-Si p-MOSFETs on SiGe-on-Insulator Substrates Fabricated by SIMOX Technology", IEDM Tech. Dig., pp. 934-936 (1999).

Recently, it has been demonstrated that a fully relaxed (>90%) SiGe buffer layer can be transferred to a handle wafer through a wafer bonding technique which is further described in U.S. Pat. No. 6,524,935 to D. F. Canaperi et al. However, the bonded SGOI wafers prepared from this prior art process still suffer from various bonding related defects, such as blisters, bubbles, voids, etc., especially for high Ge content SGOI wafers where the Ge content is larger than 25 atomic (at.) %.

U.S. Patent Application Publication No. 2006/0054891 to Chu et al. discloses a method of preparing a substantially defect free SGOI substrate including a SiGe layer having a Ge content of greater than 25%. The method disclosed in the '891 publication is similar to the present invention except that the implant step uses only hydrogen ions. The method disclosed in the '891 publication is basically restricted to a "relatively" high temperature $H_2^+$ splitting process which is from about 450° to about 650° C.

In view of the prior art mentioned above, a new and improved method of fabricating a substantially defect free strained semiconductor-on-insulator substrate is needed.

SUMMARY OF THE INVENTION

The present invention describes, in one embodiment, a method for achieving a substantially defect free SGOI substrate which includes a SiGe layer that has a high Ge content of greater than about 25 atomic % and up to about 80 atomic % using a novel low temperature wafer bonding technique substantially applicable to the SiGe/SiGeC material systems. Typically, the Ge content is from about 30 to about 70 atomic %. The term "substantially defect free" is used in the present application to denote a SiGe layer that has a defect density, including misfits, threading defects, microtwins, stacking faults and other defects, of about $10^4$-$10^5$ defects/cm$^2$ or less.

In accordance with the present invention, the SiGe layer present in the final structure, typically at the interface between the SiGe layer and the underlying interfacial layer, includes boron (B) in a concentration from about $10^{15}$ to about $10^{18}$ atoms/cm$^3$. Applicants observe that the concentration of B present in the SiGe layer is low enough to compensate for strain, yet the concentration is high enough to induced low temperature splitting.

In addition to SGOI substrates, the present invention also provides a method of fabricating a substantially defect free SiGeC, stained Si, or SiC layer directly on an insulator. In each of the embodiments contemplated, B is present in the concentration mentioned above.

The wafer bonding process described in the present application includes the co-implantation of hydrogen with boron to form a "smarter", smart-cut region within the relaxed semiconductor layer, e.g., SiGe or SiGeC layer, so as to drastically reduce and lower the layer-splitting temperature for blister formation from the conventional 500°-650° C. to ultra-low temperatures in the range from about 300° to about 400° C. Furthermore, by increasing the B dosage or incorporating the highest B dosage in the range of about $5 \times 10^{14}$ cm$^{-2}$ for the co-implantation process, the final blistering time for the layer-splitting process can be further reduced by a factor of about 15 times and effectively achieve a highly efficient layer transfer process of about 1 minute at 300° C. for a 30% SiGe buffer layer.

More specifically, the inventive "smarter" smart-cut process is substantially tailored to be implemented in a low-temperature layer-transfer and selective etch back wafer bonding scheme to generate ultra-thin layers in the range from about 2 nm to about 50 nm of tensilely strained Si or SiC layers or fully relaxed (>90%) SiGe or SiGeC on insulator substrates.

In general, this lower temperature, "smarter" smart-cut process maintains the desired strain or relaxed layer on the insulator whereby all the strain related components such as the strain composition, Ge content, dopant (i.e., B, P, As, etc.) content, thickness or structural integrity is completely maintained through the layer-transfer process before subjecting and transforming the final bonded structure to the final annealing phase of the wafer bonding process. It is to be noted the addition of carbon to the silicon layer can further enhance or increase the tensile strain as well as increase the thermal conductivity of the strained Si layer making it more suitable for device fabrication and thermal cycling, especially since it's well known that SSDOI devices suffers from self-heating effects.

In a similar regard, incorporating isotopically-pure silicon-28 (versus its natural abundance of 92% in natural Si) within the desired tensile strained Si or SiC layers or the compressive or relaxed SiGe layers can further increase the thermal conductivity of these bonded layers to the oxide insulator substrate. A gain of approximately 55% in the thermal conductivity of isotopically-pure silicon-28 as compared to that of natural Si has been reported by Komarov et al, "Transient Thermo-Reflectance Measurements of the Thermal Conductivity and Interface Resistance of Metallized Natural and Isotopically-Pure Silicon", Microelectronics Journal, pp. 1335 (2003).

In one embodiment of the present invention, a method of forming a SiGe-on-insulator substrate is provided that comprises the steps of:

forming a low temperature oxide atop a structure that comprises a fully relaxed SiGe layer located on a sacrificial substrate;

first annealing said structure including said low temperature oxide at a first adequate low annealing temperature to minimize the formation of the desired interfacial layer comprising the elements of Si, Ge and O between the low temperature oxide and said SiGe layer;

providing a low temperature implant region within said fully relaxed SiGe layer using a combination of $H_2^+$ and B;

bonding said low temperature oxide to a surface of a semiconductor substrate, wherein said bonding comprises contact bonding to form a bond between an exposed surface of said low temperature oxide and said semiconductor substrate, a second anneal at a second temperature to strengthen said bond, and a third anneal performed at a third temperature that is greater than the second temperature to cause separation at said implant region within said fully relaxed SiGe layer, whereby said sacrificial substrate and a portion of the fully relaxed SiGe layer are removed; and re-annealing the structure at a fourth temperature that is greater than the third temperature to form a SiGe-on-insulator (SGOI) substrate that comprises the semiconductor substrate, said low temperature oxide located on said semiconductor substrate, and said fully relaxed SiGe layer having a defect density of about $10^3$-$10^5$ defects/cm$^2$ or less and a Ge content that is greater than 25 atomic % located atop said low temperature oxide, wherein said low temperature oxide and said fully relaxed SiGe layer are separated by said SiGeO interfacial layer.

In another embodiment of the present invention, a method of forming a thin SiGe-on-insulator substrate is provided that comprises the steps of:

forming a Si etch stop followed by a thin SiGe layer having a desired thickness atop a structure that comprises a fully relaxed SiGe layer located on a sacrificial substrate;

forming a low temperature oxide on said thin SiGe layer;

first annealing said structure including said low temperature oxide at a first adequate low temperature to form a suitable interfacial layer comprising the elements of Si, Ge and O between the low temperature oxide and said thin SiGe layer;

providing a low temperature implant region within said fully relaxed SiGe layer using a combination of $H_2^+$ and B;

bonding said low temperature oxide to a surface of a semiconductor substrate, wherein said bonding comprises contact bonding to form a bond between an exposed surface of said low temperature oxide and said semiconductor substrate, a second anneal at a second temperature to strengthen said bond, and a third anneal performed at a third temperature that is greater than the second temperature to cause separation at said implant region within said fully relaxed SiGe layer, whereby said sacrificial substrate and a portion of the fully relaxed SiGe layer are removed leaving a portion of the relaxed SiGe layer, the Si etch stop and the thin SiGe layer atop of the oxide that is now bonded to said semiconductor substrate;

performing sequential selective etching to first remove the remaining portions of the relaxed SiGe layer followed by the second selective etching of the Si etch stop leaving only the thin SiGe layer atop of the bonded oxide layer; and re-annealing the structure at a fourth temperature that is greater than the third temperature to form a SiGe-on-insulator (SGOI) substrate that comprises the semiconductor substrate, said low temperature oxide located on said semiconductor substrate, and said fully relaxed SiGe layer having a defect density of about $10^3$-$10^5$ defects/cm$^2$ or less and a Ge content that is greater than 25 atomic % located atop said low temperature oxide, wherein said low temperature oxide and said fully relaxed SiGe layer are separated by said interfacial layer.

In yet another embodiment of the present invention, a method of forming a thin strained Si-on-insulator substrate is provided that comprises the steps of:

forming a SiGe etch stop followed by a thin strained Si layer having a desired thickness atop a structure that comprises a fully relaxed SiGe layer located on a sacrificial substrate;

forming a low temperature oxide on said thin strained Si layer;

first annealing said structure including said low temperature oxide at a first adequate low temperature to form a suitable interfacial layer comprising the elements of Si, Ge and O between the low temperature oxide and said thin strained Si layer;

providing a low temperature implant region within said fully relaxed SiGe layer using a combination of $H_2^+$ and B;

bonding said low temperature oxide to a surface of a semiconductor substrate, wherein said bonding comprises contact bonding to form a bond between an exposed surface of said low temperature oxide and said semiconductor substrate, a second anneal at a second temperature to strengthen said bond, and a third anneal performed at a third temperature that is greater than the second temperature to cause separation at said implant region within said fully relaxed SiGe layer, whereby said sacrificial substrate and a portion of the fully relaxed SiGe layer are removed leaving a portion of the relaxed SiGe layer, the SiGe etch stop and the thin strained Si layer atop of the oxide that is now bonded to said semiconductor substrate;

performing sequential selective etching to first remove the remaining portions of the relaxed SiGe layer followed by the second selective etching of the SiGe etch stop leaving only the thin strained Si layer atop of the bonded oxide layer; and re-annealing the structure at a fourth temperature that is greater than the third temperature to form a strained Si directory-on-insulator (SSDOI) substrate that comprises the semiconductor substrate, said low temperature oxide located on said semiconductor substrate, and said tensilely strained Si layer having a defect density of about $10^3$-$10^5$ defects/cm$^2$ or less and a strain content that is greater than 1% located atop said low temperature oxide, wherein said low temperature oxide and said fully relaxed SiGe layer are separated by said interfacial layer.

In an even further embodiment of the present invention, a method of forming a thin strained SiC-on-insulator substrate is provided that comprises the steps of:

forming a SiGe etch stop followed by a thin strained SiC layer having a desired thickness atop a structure that comprises a fully relaxed SiGe layer located on a sacrificial substrate;

forming a low temperature oxide atop said thin strained SiC layer;

first annealing said structure including said low temperature oxide at a first adequate low temperature to form a suitable interfacial layer comprising the elements of Si, C and O between the low temperature oxide and said thin SiC layer;

providing a low temperature implant region within said fully relaxed SiGe layer using a combination of $H_2^+$ and B;

bonding said low temperature oxide to a surface of a semiconductor substrate, wherein said bonding comprises contact bonding to form a bond between an exposed surface of said low temperature oxide and said semiconductor substrate, a second anneal at a second temperature to strengthen said bond, and a third anneal performed at a third temperature that is greater than the second temperature to cause separation at said implant region within said fully relaxed SiGe layer, whereby said sacrificial substrate and a portion of the fully relaxed SiGe layer are removed leaving a portion of the relaxed SiGe layer, the SiGe etch stop and the thin strained SiC layer atop of the oxide that is now bonded to said semiconductor substrate;

performing sequential selective etching to first remove the remaining portions of the relaxed SiGe layer followed by the second selective etching of the SiGe etch stop leaving only the thin strained SiC layer atop of the bonded oxide layer; and re-annealing the structure at a fourth temperature that is greater than the third temperature to form a strained SiC directly-on-insulator (SSCDOI) substrate that comprises the semiconductor substrate, said low temperature oxide located on said semiconductor substrate, and said strained SiC layer having a defect density of about $10^3$-$10^5$ defects/cm$^2$ or less and a strain content that is greater than 1% located atop said low temperature oxide, wherein said low temperature oxide and said fully strained SiC layer are separated by said interfacial layer.

In addition to the methods described above, the present invention also provides layered structures. In one embodiment, a layered structure comprising a substrate having an upper surface of single crystalline Si, a bonded oxide over said upper surface preferably from wafer bonding, a SiGeO interfacial layer over said bonded layer generated from pre-bonding annealing, a relaxed SiGe layer atop of the bonded oxide, wherein said relaxed SiGe layer has a thickness from about 1 nm to about 40 nm and a boron content from about $10^{15}$ to about $10^{18}$ atoms/cm$^3$.

In another embodiment, a layered structure is provided that comprises a substrate having an upper surface of single crystalline Si, a bonded oxide over said upper surface preferably from wafer bonding, and a suitable SiGeO or SiC—O interfacial layer over said bonded layer generated from pre-bonding annealing, and a tensilely strained Si layer atop of the bonded oxide, wherein said Si layer has a thickness from about 1 nm to about 40 nm, a strain content in the range from 1-3% and a boron content from about $10^{15}$ to about $10^{18}$ atoms/cm$^3$.

In yet another embodiment, a layered structure is provided that comprises a substrate having an upper surface of single crystalline Si, a bonded oxide over said upper surface preferably from wafer bonding, a suitable SiC—O interfacial layer over said bonded layer generated from pre-bonding annealing, and a tensilely strained SiC layer atop of the bonded oxide wherein said SiC layer has a thickness from about 1 nm to about 40 nm, a strain content in the range from 1-4% and a boron content from about $10^{15}$ to about $10^{18}$ atoms/cm$^3$.

In a further embodiment of the present invention, a layered structure is provided that comprises a substrate having an upper surface of single crystalline Si, a bonded oxide over said upper surface preferably from wafer bonding, a suitable SiGeO or SiC—O interfacial layer over said bonded layer generated from pre-bonding annealing, a tensilely strained Si layer atop of the bonded oxide, wherein said Si layer has a thickness from about 1 nm to about 5 nm and a boron content from about $10^{15}$ to about $10^{18}$ atoms/cm$^3$, and a greater tensilely strained SiC layer atop of the strained Si layer wherein said SiC layer has a thickness from 1 nm to about 40 nm with a strain content in the range from 1-5%.

In a still further embodiment of the present invention, a layered structure is provided that comprises a substrate having an upper surface of single crystalline Si, a bonded oxide over said upper surface preferably from wafer bonding, a suitable SiGeO or SiC—O interfacial layer over said bonded layer generated from pre-bonding annealing, a tensilely strained SiC layer atop of the bonded oxide wherein said SiC layer has a thickness from about 1 nm to about 10 nm and a boron content from about $10^{15}$ to about $10^{18}$ atoms/cm$^3$, and a compressively strained Si layer atop of the tensilely strained SiC layer wherein said Si layer has a thickness from 1 nm to about 40 nm.

In the various embodiments mentioned above, the strain, if not specified, may be tensile or compressive. Additionally, the present invention contemplated forming additional semiconductor materials the semiconductor layer that is located atop the buried oxide. The additional semiconductor materials may have the same or opposite stress sign as that of the semiconductor layer that is located atop the buried oxide.

BRIEF DESCRIPTION OF THE DRAWINGS

FIG. 4A-4F are pictorial representations (through cross sectional views) illustrating the processing steps that employed in the present invention for fabricating a substantially defect free, tensilely-strained Si directly-on-insulator substrate.

DETAILED DESCRIPTION OF THE INVENTION

Figure 1C:
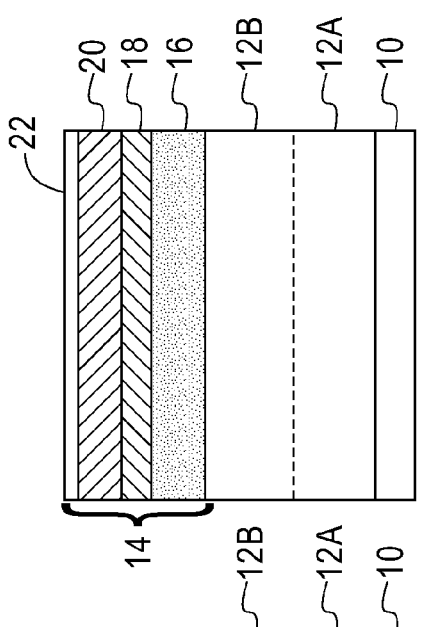
FIGS. 1A-1F are pictorial representations (through cross sectional views) illustrating the processing steps that are employed in the present invention for fabricating a substantially defect free, high Ge content SGOI substrate.

The present invention, which provides a method of fabricating high quality, near defect-free SiGe (optionally including C)-on-insulators (SGOI), strained-Si-directly-on-insulator (SSDOI) and silicon carbon-on-insulator (SCOI) substrates utilizing a smarter cut method, will now be described in a greater detail by referring to the following discussion and drawings that accompany the present application. It is noted that the drawings of the present application are provided for illustrative purposes and, as such, they are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

As stated above, the present invention provides a method for fabricating high quality, near defect-free SiGe (optionally including C)-on-insulators (SGOI), strained-Si-directly-on-insulator (SSDOI) and silicon carbon-on-insulator (SCOI) substrates utilizing a smarter cut method. The term "substantially defect free" is used in the present application to denote a semiconductor layer, i.e., a SiGe layer, a strained Si layer, or a SiC that has a defect density, including misfits, threading defects, microtwins, stacking faults and other defects, that is about $10^4$-$10^5$ defects/cm$^2$ or less. In the present invention, the semiconductor layer is present on an interfacial layer that is present between the buried oxide and the semiconductor layer. The semiconductor layer has a boron content from about $10^{15}$ to about $10^{18}$ atoms/cm$^3$. Applicants observe that the concentration of B present in the semiconductor layer, e.g., SiGe, is low enough to compensate for strain, yet the concentration is high enough to induced low temperature splitting.

Reference is now made to the following discussion in which a high quality, near defect free SGOI substrate is prepared. In this embodiment of the present invention, a method for achieving a substantially defect free SGOI substrate which includes a SiGe layer that has a high Ge content of greater than about 25 atomic % and up to about 80 atomic % is described using a novel low temperature wafer bonding technique substantially applicable to the SiGe/SiGeC material systems.

The present invention describing a process for realizing a low defect variable Ge content SGOI substrate using boron and hydrogen co-implantation, wafer bonding and layer transfer techniques will now be described in detail by referring to FIGS. 1A-1F. The inventive method begins by depositing a SiGe buffer layer deposited step-gradedly, i.e., starting with a low Ge content (on the order of about 30% Ge or less, preferably from about 5 to about 20% Ge) and step wisely increasing the Ge content, gradually reaching the intended high Ge content (on the order of greater than 30% Ge, preferably about 50 to about 75% Ge), on a blank bulk Si wafer. In FIG. 1A, the bulk substrate is labeled as 10 and the lower portion of the SiGe buffer layer (i.e., the step graded region) having the low Ge content is labeled as 12A.

After the target Ge content is reached, another SiGe layer having a thickness of about 1 to about 2 microns and the same Ge content as the upper portion of SiGe buffer layer is deposited forming a fully relaxed (>90%) SiGe layer on the lower portion 12A of the SiGe buffer layer. Either an ultra high vacuum chemical vapor deposition (UHVCVD) process or a rapid thermal chemical vapor deposition (RTCVD) process can be used to achieve the above.

Since the surface of the deposited fully-relaxed SiGe buffer layer with high Ge content is quite rough (usually with a peak-to-peak roughness—$R_{max}$ from about 40 nm to about 100 nm), chemical mechanical polishing (CMP) is needed to smooth the surface. In order to reduce the particle sticking problem, wafers need to be polished under a low down-force, usually at 1 to 2 psi. The preferred final surface condition is at $R_{max}$ less than 10 nm. After CMP, the wafers with the surface-smoothed and thickness reduced SiGe layer need to be cleaned using a modified RCA wet clean to remove particles and residuals left from CMP. It is often found that multiple cleans are required to obtain a sufficiently clean and particle-free surface. In FIG. 1A, the polished, thinned and fully relaxed SiGe buffer layer is labeled as 12B.

Figure 1B:
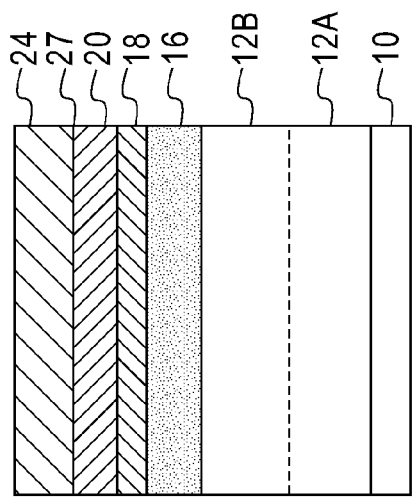
Figure 1A:
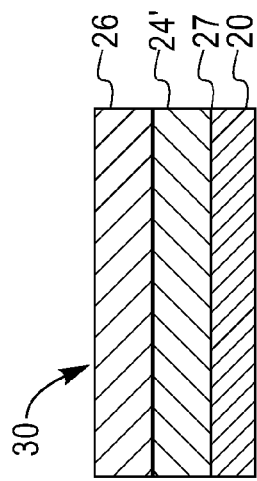

In FIG. 1B, a film stack 14 comprising a SiGe layer 16 (with identical or a close Ge content as the buffer layer 12B), a Si etch stop layer 18, and a strained SiGe layer 20 having a strain greater than 30% as well as thin Si cap layer 22 having a thickness from about 3 to about 5 angstroms is regrown on top of the polished and thinned SiGe buffer layer 12B. The film stack 14 is formed utilizing conventional deposition techniques that are well known to those skilled in the art.

Afterwards, a low temperature oxide (LTO) 24 is deposited on top of the regrown film stack 14 by either a plasma enhanced chemical vapor deposition (PECVD) process or a low pressure chemical vapor deposition (LPCVD) process providing the structure shown, for example, in FIG. 1C. Note that the LTO 24 consumes the Si cap 22. Afterwards, an anneal at an elevated temperature T1 for an extensive length of time is used to drive out excessive hydroxyl groups and volatile gases inside the LTO 24, as well as to densify the LTO layer 24. Typically, T1 is performed at a temperature from about 550° to about 850° C., with a temperature range for T1 from about 650° to about 750° C. being even more typical. The duration of the anneal is typically from about 30 to about 450 minutes, with an anneal duration from about 60 to about 300 minutes being even more typical.

In some embodiments of the present invention, the thickness of any possible Ge—Si-Ox interfacial oxide can be minimized by first depositing a thin layer having a thickness of about 20 to about 100 angstroms of a rapid thermal chemical vapor deposited (RTCVD) high temperature oxide (HTO) on top of the Si cap layer 22 immediately before the LTO deposition. This particular embodiment of the present invention is not illustrated, but if employed, the lower region of the LTO film 24 abutting the strained SiGe layer 20 shown in FIG. 1C would include a HTO.

The intermediate Ge—Si-Ox interfacial (hereinafter SiGeO interfacial) layer 27, which might cause electrical active interfacial states and can result in bad device properties on devices produced on these substrates, can be avoided as follows: The SiGe graded buffer layer is produced as described above. Next, a thin screening oxide is deposited on the SiGe layer by either a plasma enhanced chemical vapor deposition (PECVD) or a low pressure chemical vapor deposition (LPCVD) method. The purpose of this oxide is to prevent surface damage during implantation.

Figure 1F:
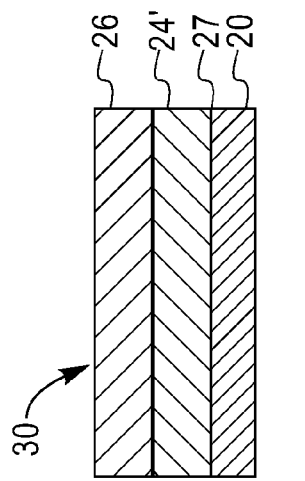

$H_2^+$ and B is then implanted by an ion implanter through the LTO 24 (and HTO if present), the strained SiGe layer 20, and the Si etch stop layer 18 into the SiGe layer 16 with the peak concentration of $H_2^+$ and boron at a desired depth. In cases of a thick LTO 24, the implantation depth 29 is anywhere in the SiGe layer 16 as shown in FIG. 1D. In case of LTO as a screening oxide the depth is 150 nm or more. The peak concentration of hydrogen and boron has to be about in the same depth, the maximum distance of the peaks can vary between 50 to 100 nm. The hydrogen ($H_2^+$) dose can vary in a range from about 1E16 to about 5E16 atoms/cm² and the boron dose can be in a range from about 1E13 to about 1E15 atoms/cm², depending of the needed splitting conditions.

Thereafter, and for a wafer with thick LTO, CMP is used to trim down the LTO layer 24 thickness to a designated one, which is used as a buried oxide (BOX) in the final SGOI wafer formed and is determined by the specifications of an application. CMP also serves to achieve a smooth LTO surface that the normal surface requirement for wafer bonding is satisfied, i.e., the root mean square surface roughness–$R_{rms}$ is less than 0.5 nm. After CMP, as mentioned before multiple modified RCA cleans (no DHF included) are required to clean the surface-smoothed and thickness-reduced LTO 24' surface. For wafers with an LTO as a screening oxide the thin LTO layer is removed by exposing the wafers in diluted HF. After the HF treatment the wafers are cleaned by modified RCA cleans to form a thin native oxide on the SiGe surface.

Figure 3:
FIG. 3 is an actual TEM cross sectional micrograph showing an SGOI substrate created using the method of the present invention.

The surface of the smoothed and cleaned LTO 24' is brought (at nominal room temperature; on the order about 20° to about 40° C.) into contact with the front side of a Si handle wafer 26 (See, FIG. 1D) after a modified RCA clean to form hydrophilic surfaces on both by terminating the surfaces with hydroxyl group, thereby promoting bonding between the mating surfaces via the initial formation of hydrogen bonds and the subsequent formation of stronger siloxane bonds later. FIG. 3 shows the cross-section of the layered structure after direct bonding to a Si handle wafer. For the wafer with the thin native oxide layer, the SiGe surface is bonded by the same process as above to a handle wafer with a thermally grown silicon oxide of a desired thickness. The thickness depends on its later application. The thermal oxide is then used as a buried oxide (BOX) in the final SGOI wafer structure.

To strengthen the bond either between the oxide (LTO) and the Si or the SiGe and the thermal oxide, the bonded stack is annealed at an elevated temperature. This post-bonding anneal temperature T2 which is on the order of about 150° to about 200° C., is kept sufficiently low to prevent hydrogen induced crack propagation in the SiGe layer 16 from occurring prior to the bond strengthening is accomplished.

Subsequently the annealing temperature is raised to the so-called split temperature T3 (T3>T2) (typically, on the order from about 250° to about 400° C.) to allow the implanted hydrogen to perform Oswald ripen effect, i.e., to form a crack in the SiGe layer 16 at the plane. A razor blade can be used to separate the two pieces at the cracked plane and to remove the original Si substrate 10 and a part of the SiGe layer 16. The separation can also occur during a splitting anneal process by itself. Thus, the layered structure including part of the SiGe layer 16, the Si etch stop layer 18, the strained SiGe layer 20 and the LTO 24' completes the transfer to Si handle wafer 26. An anneal at a higher temperature T4 (T4>T3) (typically on the order of about 650° to about 850° C.) is usually applied to further strengthen the bond between layers.

Figure 1E:
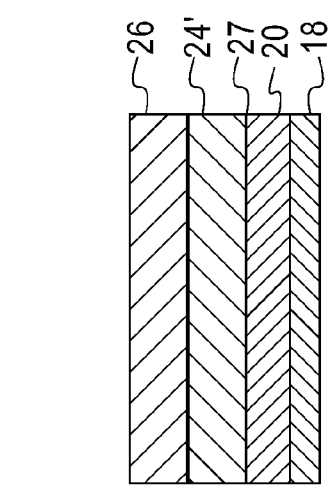
Figure 1D:
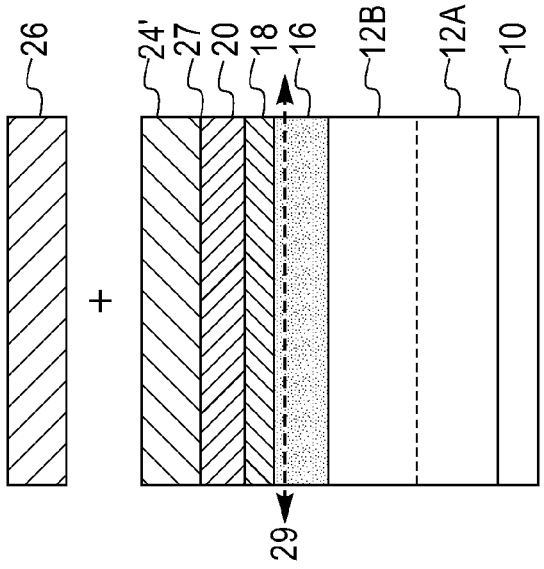

Following the above processing steps, the transferred portion of the SiGe layer 16 is removed by CMP and etching to provide the structure shown in FIG. 1E. The etching process includes the use of a chemical etchant that selectively removes the SiGe layer 16. One example of such a chemical etchant is an etchant mixture including $HF:H_2O_2$:acetic acid.

The Si etch stop layer 18 is then removed utilizing a chemical etchant (such as, for example, EPPW, TMAH (i.e., trimethylammonium hydroxide) and KOH (i.e., potassium hydroxide)) providing the SGOI structure 30 shown in FIG. 1F. The SGO structure 30 includes a handle wafer 26, a LTO (or possible LTO/HTO stack) 24' as the buried insulating layer and the strained SiGe layer 20 (strain greater than 30%) as the SGOI device layer. In the present invention, the strained SiGe layer 20 has a boron concentration from about $10^{15}$ to about $10^{18}$ atoms/cm$^3$.

A final thickness, designated by a specific application, of the transferred SGOI layer (strained SiGe layer 20) can be obtained by CMP, ion-beam etch, high pressure oxidation and wet etch, or a selective etch stop at the Si etch stop layer. Usually prior to the thickness reduction, the surface of the transferred, strained SiGe layer 20 is smoothed by a polish at a low down-force.

Figure 2:
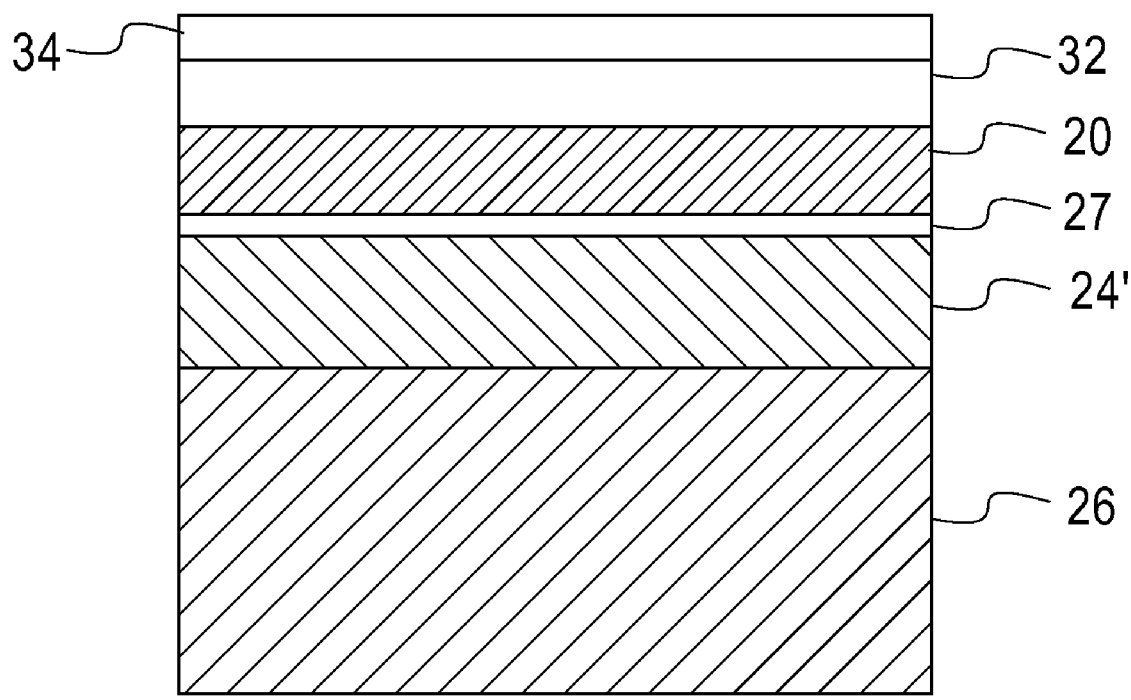
FIG. 2 is a pictorial representation (through a cross sectional view) illustrating additional semiconductor layers that can be formed atop the SGOI substrate provided in FIG. 1F.

After the SGOI thickness is reduced to the final one, a thin SiGe layer 32 with either the same Ge content as the strained SiGe layer 20 or with a higher Ge content can be re-grown on top of the SiGe layer 20 and subsequently a thin layer of epitaxial Si 34 can be deposited at the final stage of the deposition. This structure including thin SiGe layer 32 and epitaxial Si layer 34 is shown, for example, in FIG. 2. The final terminated thin epitaxial Si 34 serves as the strained silicon layer to be used as a critical material in the later device fabrications.

In some embodiments of the present invention, the strained SiGe layer 20 may also include C.

The present invention also provides a process for fabricating a low defect strained-silicon-directly-on-insulator (SSDOI) substrate achieved at a much lower wafer splitting temperature involving again boron and hydrogen co-implantation, wafer bonding and layer transfer techniques. This embodiment of the present invention begins by first providing the structure shown in FIG. 4A. The structure shown in FIG. 4A includes the same materials as that shown in FIG. 1A and the same processing steps as described above can be used in forming the same.

Next, a film stack 14' including a thin regrown SiGe layer 16, a SiGe etch stop layer 18', an epitaxial strained silicon layer 20' (strain greater than 30%) and a Si cap 22 is deposited on the fully relaxed and smoothed SiGe film 12B with the final epitaxial silicon 20' to form a strained silicon layer, as shown in FIG. 4B. C may optionally be present within layer 20'. This step can also be accomplished by either UHVCVD or RTCVD method, but preferably an UHVCVD tool is employed.

A thin layer of high temperature oxide 25 having a thickness from about 100 to about 300 angstroms is either grown or deposited (using RTCVD) above the strained silicon layer 20' before a much thicker low temperature oxide (LTO) 24 is deposited by either a plasma enhanced chemical vapor deposition (PECVD) or a low pressure chemical vapor deposition (LPCVD) method. In this embodiment, the thin layer of high temperature oxide 25 is used as a diffusion barrier to reduce or stop Ge penetration into the strained epitaxial silicon layer 20'. Afterwards, an anneal at an elevated temperature T1 for an extensive length of time (typically from about 700° to about 850° C. for 30 to about 300 minutes) is used to drive out excessive hydroxyl groups and volatile gases inside the LTO, as well as densifying the LTO structure.

$H_2^+$ and boron are then implanted sequentially by an ion implanter through the LTO 24, the thin HTO layer 25, the Si cap 22, the strained epitaxial silicon layer 20' and the SiGe etch stop 18' into the SiGe layer 16 with the peak concentration of $H_2^+$ and boron at a desired depth in the SiGe layer 16. It should be noted that the peak concentration of the hydrogen and the boron has to be at about the same depth. For example, with the LTO thickness of 3000 angstroms, the HTO thickness of 250 angstroms, and the strained silicon thickness of 250 angstroms the required implant energies for $H_2^+$ and boron to have peak concentration at about 2500 angstroms into SiGe layer 16 are 125 KeV and 206 KeV, respectively. The dose needed for obtaining a good wafer splitting result is from about 1E16 to about 5E16 ions/cm$^2$ for $H_2^+$ and from about 2E14 to about 4 E14 ions/cm$^2$ for boron.

Thereafter, CMP is used to trim down the LTO thickness to a designated one, which is used as a buried oxide (BOX) in the final SSDOI wafer form and is determined by the specifications of an application. CMP also serves to achieve such a smooth LTO surface that the normal surface requirement for wafer bonding is satisfied, i.e. the root mean square surface roughness–$R_{rms}$ is less than 0.5 nm. After CMP, as mentioned before multiple modified RCA cleans (no DHF included) are required to clean the surface-smoothed and thickness-reduced LTO's 24' surface (See, FIG. 4D).

The surface of the smoothed and cleaned LTO 24' is brought (at nominal room temperature) into contact with the front side of a Si handle wafer 26 (See, FIG. 4D) after a modified RCA clean to form hydrophilic surfaces on both by terminating the surfaces with hydroxyl group, thereby promoting bonding between the mating surfaces via the initial formation of hydrogen bonds and the subsequent formation of stronger siloxane bonds later.

To strengthen the bond between the oxide (LTO) and the Si handle wafer, the bonded stack is annealed at an elevated temperature for an extensive length of time (typically from about 20 to about 48 hours). This post-bonding anneal temperature T2 (typically from about 200° to about 230° C.), is kept sufficiently low to prevent hydrogen induced crack propagation in the SiGe layer 14 from occurring prior to the bond strengthening is accomplished. Subsequently the annealing temperature is raised to the so-called wafer split temperature T3 (T3>T2) (typically from about 285° to about 315° C.) to allow hydrogen to perform an Oswald ripen effect, i.e., to form a crack in the SiGe layer 16. A razor blade can be used to separate the two pieces at the cracked plane and to remove the original Si substrate 10 and a part of the SiGe layer 16. The separation can also occurs during the splitting anneal process by itself.

FIG. 4E illustrates the structure after this bonding process has been performed. It should be noted that such a low temperature split achieved is a result directly from the $H_2^+$ and boron co-implantation. Furthermore, low temperature split reduces the chance of blistering and bubbling so that low defective bonded SSDOI wafers can be obtained. An anneal at a higher temperature T4 (T4>T3) (typically from about 450° to about 600° C.) is usually applied to further strengthen the bond between layers after wafer splitting.

The final SSDOI substrate 50 shown in FIG. 4F can be obtained by going through first a touch-up CMP with a low down-force to smooth the residual SiGe buffer layer and then wet etch using hot (80° C.) RCA clean solution to remove the remaining SiGe layer and stop at the strained silicon layer.

Figure 5:
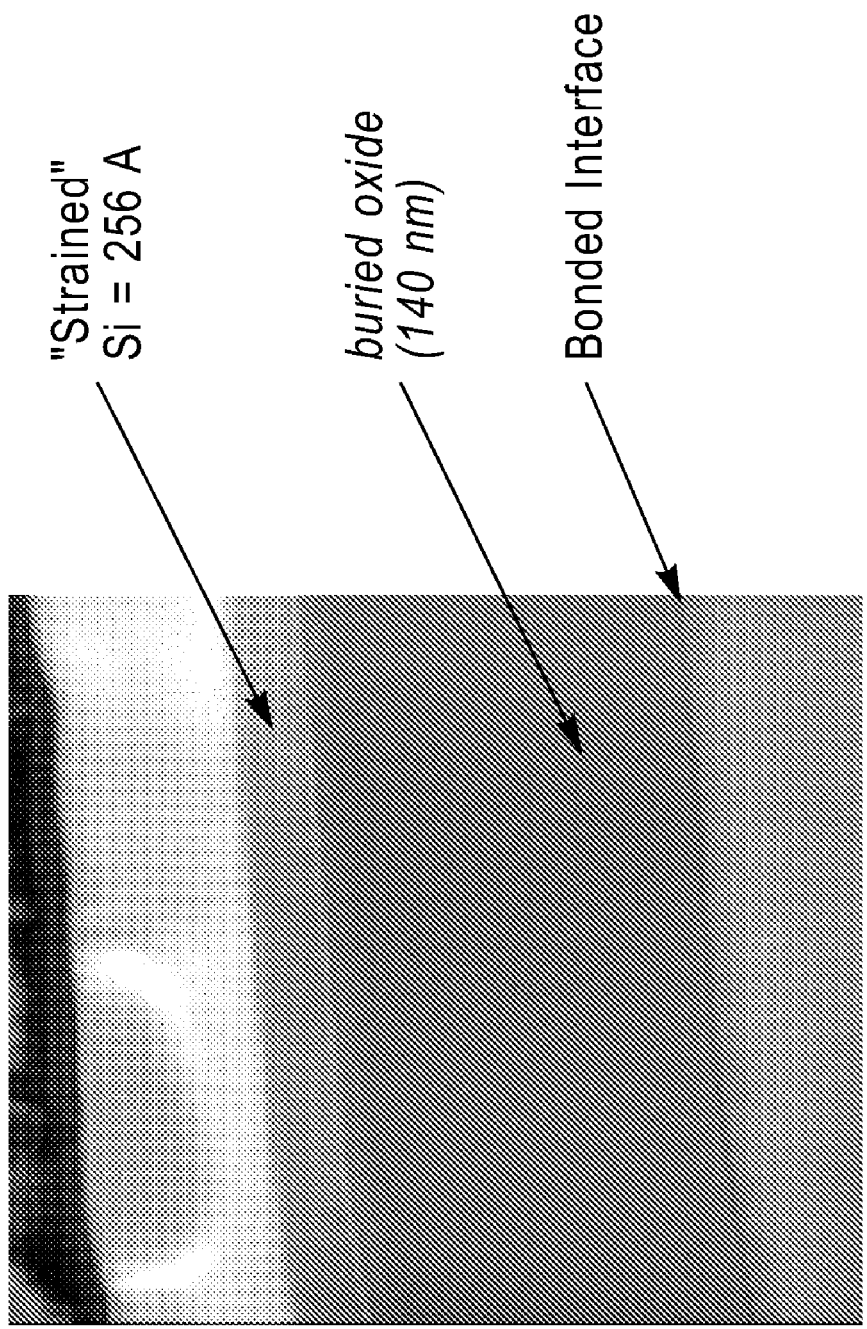
FIG. 5 is an actual TEM cross sectional micrograph showing an SSDOI substrate created using the method of the present invention.

FIG. 5 is an actual TEM cross sectional micrograph showing an SSDOI substrate created using the method of the present invention.

In a third embodiment of the present invention, a strained SiC-on-insulator is formed utilizing the same basic processing steps as described above in either the first or second embodiments of the invention. In this embodiment of the present invention, strained SiC layer is formed instead of a strained SiGe or Si layer.

In either of the embodiments mentioned above, isotopically-pure silicon-28 (versus its natural abundance of 92% in natural Si) within the desired tensile strained Si or SiC layers or the compressive or relaxed SiGe layers can be used to further increase the thermal conductivity of these bonded layers to the oxide insulator substrate.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a thin strained semiconductor-on-insulator substrate comprising:

forming a SiGe etch stop followed by a thin strained semiconductor layer having the desired thickness atop a structure that comprises a fully relaxed SiGe layer located on a sacrificial substrate;

first annealing said structure including said low temperature oxide at a first temperature to form an interfacial layer comprising the elements of Si, Ge and O between the low temperature oxide and said fully relaxed SiGe layer;

providing a low temperature implant region within said fully relaxed SiGe layer using a combination of $H_2^+$ and B;

bonding said low temperature oxide to a surface of a semiconductor substrate, wherein said bonding comprises contact bonding to foam a bond between said exposed surface of said low temperature oxide and said semiconductor substrate, a second anneal at a second temperature to strengthen said bond, and a third anneal performed at a third temperature that is greater than the second temperature to cause separation at said implant region within said fully relaxed SiGe layer, whereby said sacrificial substrate and a portion of the fully relaxed SiGe layer are removed leaving a portion of the relaxed SiGe layer, the SiGe etch stop and the thin strained semiconductor layer atop of the oxide that is now bonded to a second semiconductor substrate;

performing sequential selective etching to first remove the remaining portions of the relaxed SiGe layer followed by the second selective etching of the SiGe etch stop leaving only the thin strained semiconductor layer atop of the bonded oxide layer; and re-annealing the structure at a fourth temperature that is greater than the third temperature to form a strained semiconductor directly-on-insulator substrate that comprises the semiconductor substrate, said low temperature oxide located on said semiconductor substrate, and said tensilely strained semiconductor layer having a defect density of about $10^3$-$10^5$ defects/cm$^2$ or less and a strain content that is greater than 1% located atop said low temperature oxide, wherein said low temperature oxide and said fully relaxed SiGe layer are separated by said interfacial layer.

2. The method of claim 1 further comprising forming a high temperature oxide on said thin strained semiconductor layer prior to forming said low temperature oxide, wherein said high temperature oxide minimizes the formation of said interfacial layer.

3. The method of claim 1 wherein said fully relaxed SiGe layer is formed by first providing a SiGe buffer layer, said SiGe buffer layer having a lower region having a Ge content of about 30% or less, and an upper region having a Ge content of greater than 30%, and then forming a SiGe layer having the same Ge content as that of the upper region of said SiGe buffer layer.

4. The method of claim 1 first annealing is performed at a temperature T1, wherein T1 is from about 550° to about 850° C.

5. The method of claim 1 wherein said $H_2^+$ is implanted utilizing an ion dosage from about 1E16 to about 5E16 atoms/cm$^2$, while said boron is implanted at an ion dosage from about 1E13 to about 1E15 atoms/cm$^2$.

6. The method of claim 1 wherein said second temperature is from about 150° to about 200° C., said third temperature is from about 250° to about 400° C., and said fourth temperature is from about 650° to about 800° C.

7. The method of claim 1 wherein said strained semiconductor comprises Si, SiC or SiGeC.

* * * * *